US012813311B2

(12) United States Patent
Mohd Najman et al.

(10) Patent No.: US 12,813,311 B2
(45) Date of Patent: Nov. 24, 2026

(54) CAPILLARY FOR A WIRE BONDING MACHINE HAVING A DYNAMICALLY ADJUSTABLE CHAMFER DIAMETER

(71) Applicant: Sandisk Technologies, Inc., Milpitas, CA (US)

(72) Inventors: Nur Syazwani Mohd Najman, Nibong Tebal (MY); Seng Yu Tan, Perai (MY); Syith Mohammad, Perai (MY); Wendy Mei Yee Lim, Batu Kawan (MY); Hooi Bin Lim, Penang (MY)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 11 days.

(21) Appl. No.: 18/478,358

(22) Filed: Sep. 29, 2023

(65) Prior Publication Data

US 2025/0149502 A1 May 8, 2025

(51) Int. Cl.

*H10W 72/00* (2026.01)
*B23K 20/00* (2006.01)
*H10W 72/59* (2026.01)

(52) U.S. Cl.

CPC ......... *H10W 72/075* (2026.01); *B23K 20/007* (2013.01); *H10W 72/07141* (2026.01); *H10W 72/59* (2026.01)

(58) Field of Classification Search

CPC . H01L 2224/78301; H01L 2924/01074; H01L 24/85

See application file for complete search history.

(56) References Cited

U.S. PATENT DOCUMENTS

| | | | | |
|---|---|---|---|---|
| 5,890,643 A * | 4/1999 | Razon | H01L 24/78 | 228/1.1 |
| 8,011,559 B2 * | 9/2011 | Cai | B23K 20/26 | 228/2.1 |
| 2002/0100790 A1 * | 8/2002 | Sonnenreich | B23K 20/004 | 228/4.5 |
| 2004/0130017 A1 * | 7/2004 | Fukumoto | H01L 24/11 | 257/E23.021 |
| 2008/0093416 A1 * | 4/2008 | Utano | H01L 24/78 | 228/110.1 |
| 2008/0197461 A1 * | 8/2008 | Yu | H01L 24/85 | 257/E23.033 |

FOREIGN PATENT DOCUMENTS

| | | | | |
|---|---|---|---|---|
| CN | 103131926 A | * | 6/2013 | |
| JP | 61079238 A | * | 4/1986 | H01L 24/85 |
| JP | 02275648 A | * | 11/1990 | H01L 24/78 |

* cited by examiner

*Primary Examiner* — Keith Walker
*Assistant Examiner* — Carlos J Gamino
(74) *Attorney, Agent, or Firm* — Dentons Durham Jones Pinegar P.C.

(57) ABSTRACT

A capillary for a wire bonding machine includes a shape memory material. When a stimulant, such as a voltage or heat, is applied to the shape memory material, the capillary changes from a first state to a second state. As the capillary changes from the first state to the second state, a diameter of a chamfer defined by the capillary also changes. During a wire bonding process, the diameter of the chamfer affects a size of a ball formed at the end of a bond wire disposed within the capillary. Thus, the size of the ball may dynamically change based on size parameters of bond pads on which the ball is placed during the wire bonding process.

20 Claims, 6 Drawing Sheets

CAPILLARY FOR A WIRE BONDING MACHINE HAVING A DYNAMICALLY ADJUSTABLE CHAMFER DIAMETER

BACKGROUND

Wire bonding is a process in which electrical connections are established between a semiconductor die or an integrated circuit and a bond pad on a circuit board or a substrate. During the wire bonding process, a bond wire is fed through a capillary of a wire bonding machine. The capillary is then positioned over the bond pad. A high-voltage electric arc is applied to the bond wire, which causes a ball to be formed at the end of the bond wire. The capillary is then lowered toward the circuit board or substrate, which causes the ball to contact the bond pad.

The circuit board or the substrate typically includes a number of different bond pads. A pitch between the bond pads, a size of a bond pad opening and/or dimensions of the bond pads may change based on a number of factors. These factors include a type of electronic device being manufactured, input/output connectivity requirements of the electronic device and signal integrity requirements of the electronic device.

As the pitch between the bond pads and/or the dimensions of the bond pads change, the wire bonding machine typically uses different capillaries having different chamfer diameters. For example, the wire bonding machine will use a capillary with a small chamfer diameter when the bond pad opening and/or the pitch between bond pads is relatively small. Likewise, as the size of the bond pad opening and/or the pitch increases, the capillary with the smaller chamfer diameter is removed and replaced with a different capillary having a larger chamfer diameter.

While the capillary is being changed or replaced, the wire bonding machine cannot be utilized, which delays manufacturing operations. Additionally, manufacturers typically need to invest in a number of different capillaries, each having chamfers with different diameters.

Accordingly, it would be beneficial for a capillary of a wire bonding machine to be usable for bond pads having a number of different dimensions and/or pitches.

SUMMARY

The present application describes a capillary for a wire bonder (or a wire bonding machine) that defines a chamfer having a dynamically adjustable diameter. In an example, at least a portion of the capillary is made from a shape memory material. When a stimulant (e.g., a voltage or heat) is applied to the capillary, the capillary changes from a first state to a second state. Additionally, the chamfer has a first diameter when the capillary is in a first state and the chamfer has a second diameter when the capillary is in a second state.

Accordingly, the present disclosure describes a capillary for a wire bonder. In an example, the capillary includes a first portion that defines a first chamfer portion. The first chamfer portion has a static diameter. The capillary also includes a second portion. The second portion defines a second chamfer portion. In an example, the second chamfer portion extends from the first chamfer portion and has a first diameter when the second portion is in a first state and has a second diameter when the second portion is in a second state.

In another example, the present disclosure describes a method that includes determining a size parameter associated with a bond pad on a substrate. A stimulant is applied to at least a portion of a capillary of a wire bonder. An amount and/or a duration of the stimulant that is applied is based, at least in part, on the determined size parameter. In an example, the stimulant causes the at least the portion of the capillary to change from a first state to a second state.

The present disclosure also describes a wire bonder that includes a bond wire dispensing means and a stimulant application means. The bond wire dispensing means defines a chamfer. In an example, the chamfer has a first diameter when the wire dispensing means is in a first state and has a second diameter when the wire dispensing means is in a second state. The stimulant application means applies a stimulant to the bond wire dispensing means which causes the bond wire dispensing means to change from the first state to the second state.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Wire bonding is a process in which electrical connections are established between a semiconductor die or an integrated circuit and a bond pad on a circuit board or a substrate. A computing component typically includes a number of bond pads. However, the size of the bond pad, a size of the bond pad opening and/or a pitch between the bond pads may change based on a number of factors. These factors include, but are not limited to, the type of computing component being manufactured, input/output connectivity requirements of the computing component and signal integrity requirements of the computing component.

As the pitch and/or the dimensions of the bond pad changes (including the size of the bond pad itself and/or a size of the bond pad opening), different capillaries having different chamfer diameters are typically used. For example, if the bond pad opening has a first set of dimensions and/or the pitch between bond pads is a first distance, a capillary having a first chamfer diameter is used. Likewise, if the bond pad opening has a second set of dimensions and/or the pitch between the bond pads is a second, larger distance, a capillary having a second, larger chamfer diameter is used.

However, each time the capillary is changed or replaced, the manufacturing time of the computing component increases. Additionally, manufacturers typically need to invest in a number of different capillaries having different chamfer diameters.

To address the above, examples described herein are directed to a capillary for a wire bonder (or a wire bonding machine) that defines a chamfer having a dynamically adjustable diameter. In an example, at least a portion of the capillary is made from a shape memory material. When a stimulant, such as voltage or heat, is applied to the capillary, the capillary changes from a first state to a second state. Additionally, the chamfer has a first diameter when the capillary is in a first state and has a second diameter when the capillary is in a second state.

Accordingly, many technical benefits may be realized including, but not limited to, reducing a tooling cost for wire bonders as a single capillary may be used for different sized bond pads and/or a pitch between bond pads and reducing or eliminating a need to transition between capillaries having different chamfer diameters.

These and other examples will be shown and described in greater detail with respect to FIG. 1A-FIG. 5.

Figure 1A:
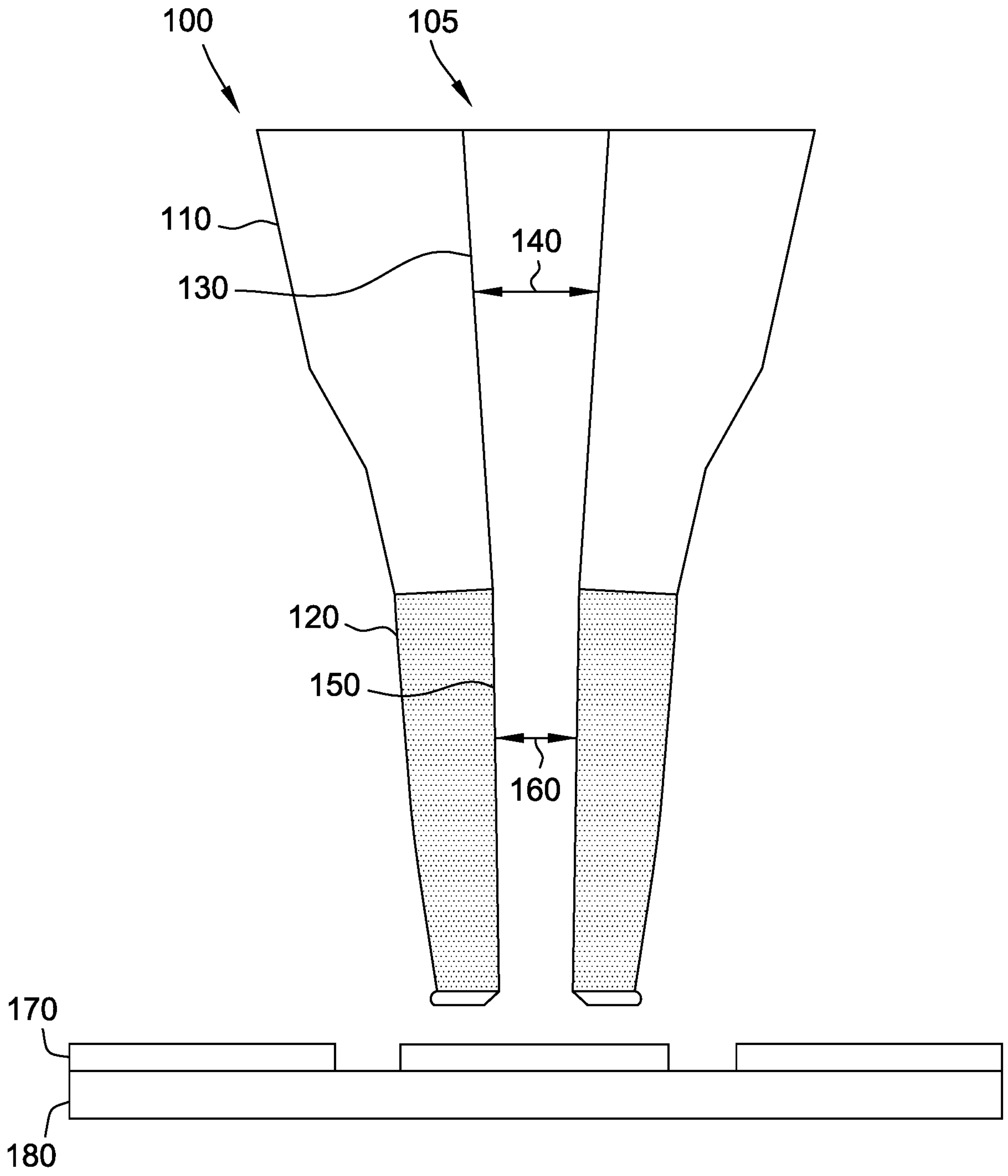
FIG. 1A is a cross-section view of a capillary of a wire bonder according to an example.

FIG. 1A is a cross-section view of a capillary 100 of a wire bonder according to an example. In an example, the capillary 100 includes a first portion 110 and a second portion 120. The first portion 110 may be part of a body of the capillary 100 and the second portion 120 may be part of a tip of the capillary 100 that extends from the body.

The capillary 100 defines a chamfer 105 that extends through the first portion 110 of the capillary 100 and the second portion 120 of the capillary 100. As such, the chamfer 105 may include a first chamfer portion 130 and a second chamfer portion 150. In an example, the second chamfer portion 150 extends from the first chamfer portion 130. Thus, the first chamfer portion 130 and the second chamfer portion 150 may form a single, unitary opening or pathway through the capillary 100. During a wire bonding process, a bond wire is disposed within the chamfer 105.

The chamfer 105 has, or otherwise defines, a diameter. In an example, the diameter of the chamfer 105 may be the same, or substantially the same, throughout the first portion 110 of the capillary 100 and the second portion 120 of the capillary 100. In another example, the diameter of the chamfer 105 may decrease from a top portion of the chamfer 105 to a bottom portion of the chamfer 105.

For example, the first chamfer portion 130 of the first portion 110 of the capillary 100 may have a first diameter at a first point (represented by the arrow 140) and the second chamfer portion 150 of the second portion 120 of the capillary 100 may have a second diameter at a second point (represented by the arrow 160). However, the diameter of the first chamfer portion 130 may be static while the diameter of the second chamfer portion 150 may be dynamic (or can dynamically change).

For example, the first portion 110 of the capillary 100 is made from a first material. The first material may be tungsten or another metal. However, the second portion 120 is made from a shape memory material. In an example, the shape memory material includes copper, nitinol, nickel, titanium, a tungsten alloy, a tungsten composite or a combination thereof. Although specific materials are mentioned, the second portion 120 may include any shape memory material(s).

Figure 1B:
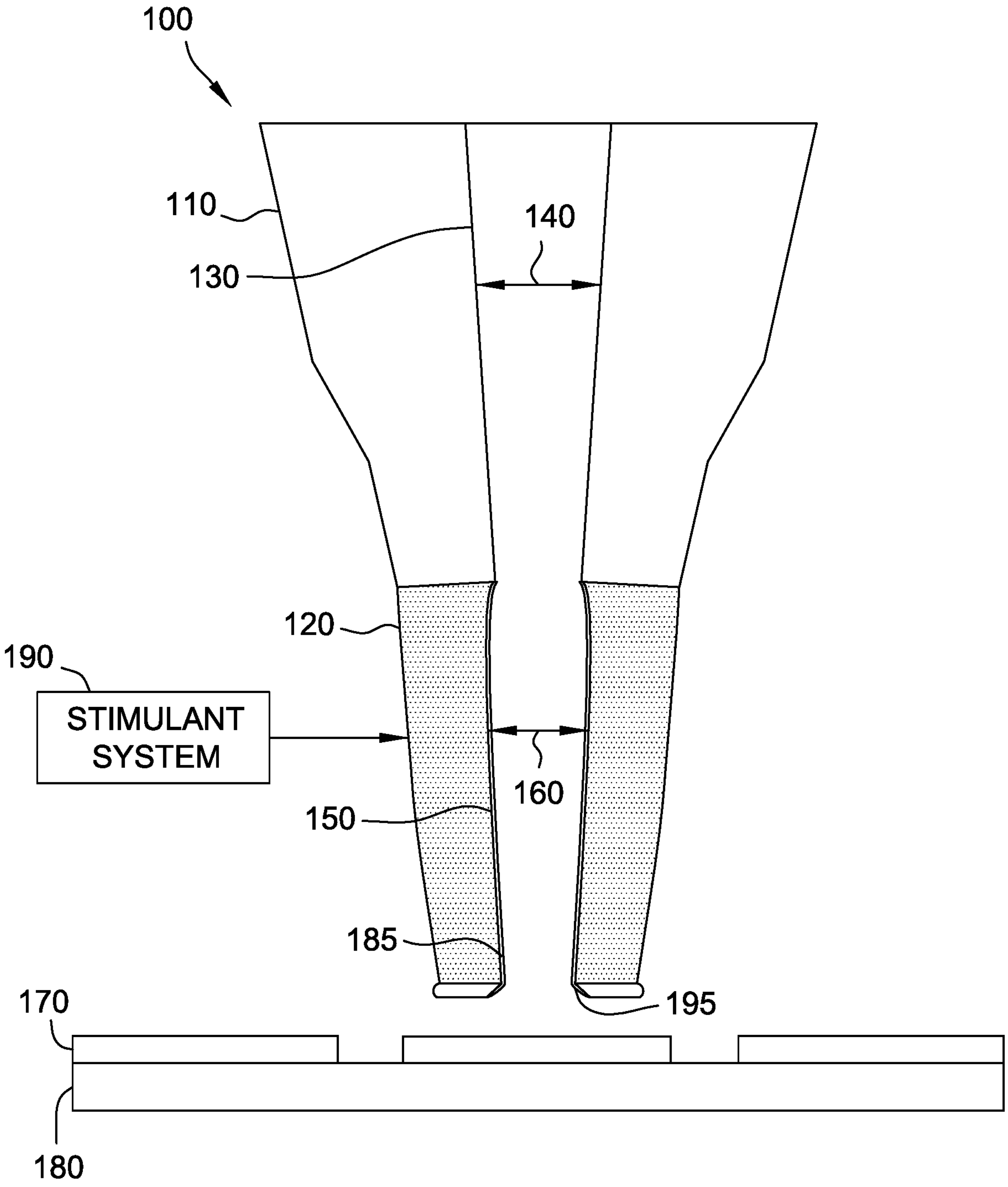
FIG. 1B illustrates the capillary of FIG. 1A in a second state according to an example.

The shape memory material enables the second portion 120 of the capillary 100 to change from a first state (such as shown in FIG. 1A) to a second state (such as shown in FIG. 1B). For example, the shape memory material enables a shape of the second portion 120 of the capillary 100 to change, which increases/decreases a diameter of the second chamfer portion 150. In another example, changing the shape of the second portion 120 of the capillary 100 may cause a length of the second chamfer portion 150 to increase/decrease.

In an example, the shape and/or diameter of the second chamfer portion 150 may change based, at least in part, on a determined or identified pitch between bond pads 170 on a substrate 180. In another example, the shape and/or diameter of the second chamfer portion 150 may change based, at least in part, on a size of the bond pads 170 and/or on a size of a bond pad opening associated with the bond pads 170.

FIG. 1B illustrates the capillary 100 of FIG. 1A in a second state according to an example. The capillary 100 may be in the second state in response to a stimulant, provided by a stimulant system 190, being applied to at least the second portion 120 of the capillary 100. In an example, the stimulant is a voltage. In another example, the stimulant is heat.

The stimulant system 190 may be any suitable system that can provide the stimulant to the second portion 120 of the capillary 100. In an example, the stimulant system 190 may be part of a wire bonder. In another example, the stimulant system 190 may be separate from the wire bonder.

In an example, the stimulant system 190 provides a determined amount of the stimulant, for a determined duration, to the second portion 120 of the capillary 100. The amount and/or the duration of the stimulant may be based on one or more factors. These factors may be determined in real time or substantially real time by a computing device or a sensor associated with the wire bonder. In another example, the factors may be predetermined and/or provided to the wire bonder. The factors may include, but are not limited to, a size of each bond pad 170, a pitch between the bond pads 170, and/or a desired or determined diameter of the second chamfer portion 150.

In an example, the stimulant system 190 continuously applies the stimulant to the second portion 120 of the capillary 100. In another example, the stimulant system 190 periodically applies the stimulant to the second portion 120 of the capillary 100. In yet another example, the stimulant system 190 applies the stimulant to the second portion 120 of the capillary 100 a single time. In any of these examples, the stimulant is applied to the second portion 120 of the capillary 100 to increase (or decrease) the diameter of the second chamfer portion 150 and/or to maintain the desired diameter.

As shown in FIG. 1B, when the stimulant system 190 applies the stimulant to at least the second portion 120 of the capillary 100, the diameter of the second chamfer portion 150 (represented by the arrow 160) is increased. In an example, as the diameter of the second chamfer portion 150 increases (or decreases), a diameter of an end point 195 of the capillary may also increase (or decrease). As the diameter of the end point 195 changes, a size of a ball formed at the end of a bond wire disposed within the capillary may also change.

In an example, an elastomeric material layer 185 may be provided on, or otherwise associated with, the second portion 120 of the capillary 100. The elastomeric material layer may be provided within the chamfer 105 (or a portion of the chamfer 105) and help prevent shorts from occurring during a wire bonding process.

Figure 2A:
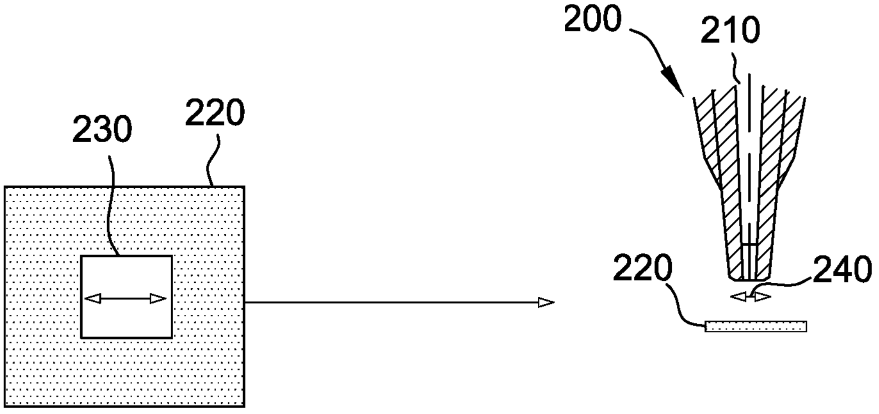
FIG. 2A illustrates a capillary of a wire bonder in a first state according to an example.

FIG. 2A illustrates a capillary 200 of a wire bonder in a first state according to an example. The capillary 200 may be similar to the capillary 100 shown and described with respect to FIG. 1A-FIG. 1B. As such, the capillary 200 may include a shape memory material that enables a diameter of a chamfer 210 to change when a stimulant is applied.

In an example, the capillary 200 is in the first state based, at least in part, on determined size parameters of a bond pad 220 (e.g., an identified/determined size of the bond pad 220, a determined/identified size of the bond pad opening 230 associated with the bond pad 220 and/or a pitch between different bond pads 220). The first state may be a state in which a stimulant is not applied to the capillary 200. As such, the chamfer 210 may have a first diameter (indicated by the arrow 240).

Figure 2B:
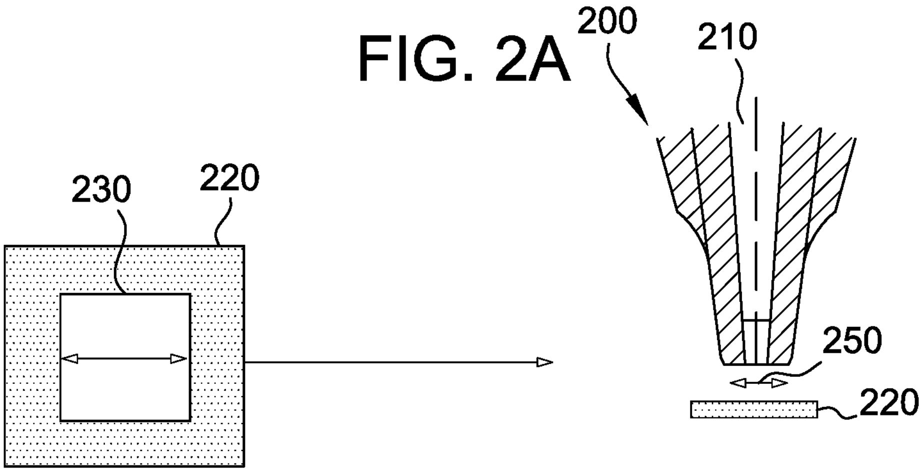
FIG. 2B illustrates the capillary of the wire bonder in a second state according to an example.

FIG. 2B illustrates the capillary 200 of the wire bonder in a second state according to an example. In this example, a stimulant has been applied to the capillary 200. An amount of stimulant and/or a duration for which the stimulant is applied is based, at least in part, on the size parameters of the bond pad 220. As a result, when the determined amount of stimulant is applied the diameter of the chamfer 210 may dynamically change until the diameter of the chamfer 210 reaches a second diameter (indicated by the arrow 250).

Figure 2C:
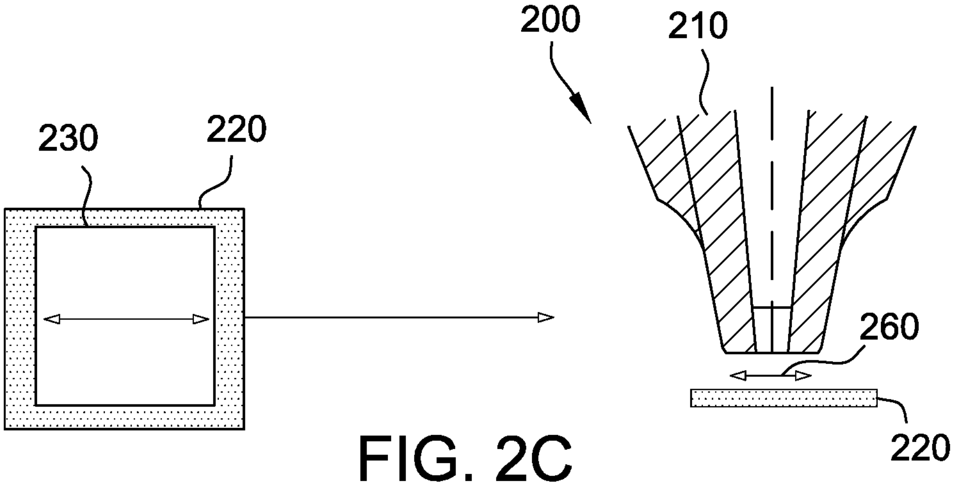
FIG. 2C illustrates the capillary of the wire bonder in a third state according to an example.

FIG. 2C illustrates the capillary 200 of the wire bonder in a third state according to an example. As with the previous example shown in FIG. 2B, a stimulant has been applied to the capillary 200. The amount of the stimulant and/or a duration for which the stimulant is applied is based, at least in part, on the size parameters of the bond pad 220. In this example, and as a result of the stimulant being applied to the capillary 200, the chamfer 210 has a third diameter (indicated by the arrow 260).

Although three different states are shown and described, the capillary 200 may take any shape or cause the chamfer 210 to have any diameter based on an applied stimulant (or a removal of the stimulant). As previously described, an amount, duration and/or type of stimulant applied may be based, at least in part, on various size parameters associated with the bond pad 220.

Figure 3:
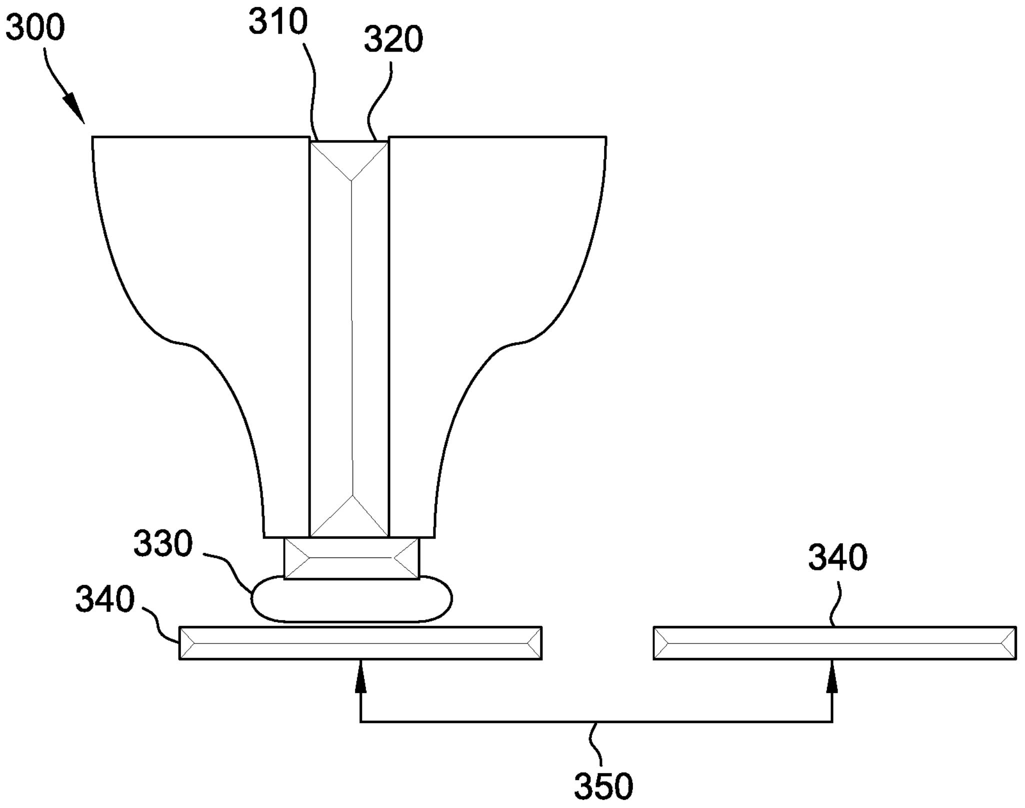
FIG. 3 illustrates a capillary having a bond wire disposed within a chamfer according to an example.

FIG. 3 illustrates a capillary 300 having a bond wire 320 disposed within a chamfer 310 according to an example. The capillary 300 may be similar to the capillary 100 shown and described with respect to FIG. 1A-FIG. 1B. As such, the capillary 300 may include or otherwise be made from a shape memory material.

As previously discussed, when a stimulant, such as heat and/or a voltage, is applied to the capillary 300, the capillary 300 may change from a first state in which the chamfer 310 has a first diameter, to a second state in which the chamfer 310 has a second, larger diameter. As the diameter of the chamfer 310 changes, a size of a ball 330 at the end of the bond wire 320 may also change. In an example, the diameter of the chamfer 310 and/or the size of the ball 330 may be based, at least in part, on a determined size of a bond pad 340 on which the ball 330 is placed, a determined or identified bond pad opening associated with the bond pad 340 and/or on a pitch 350 between the bond pads 340.

Figure 4:
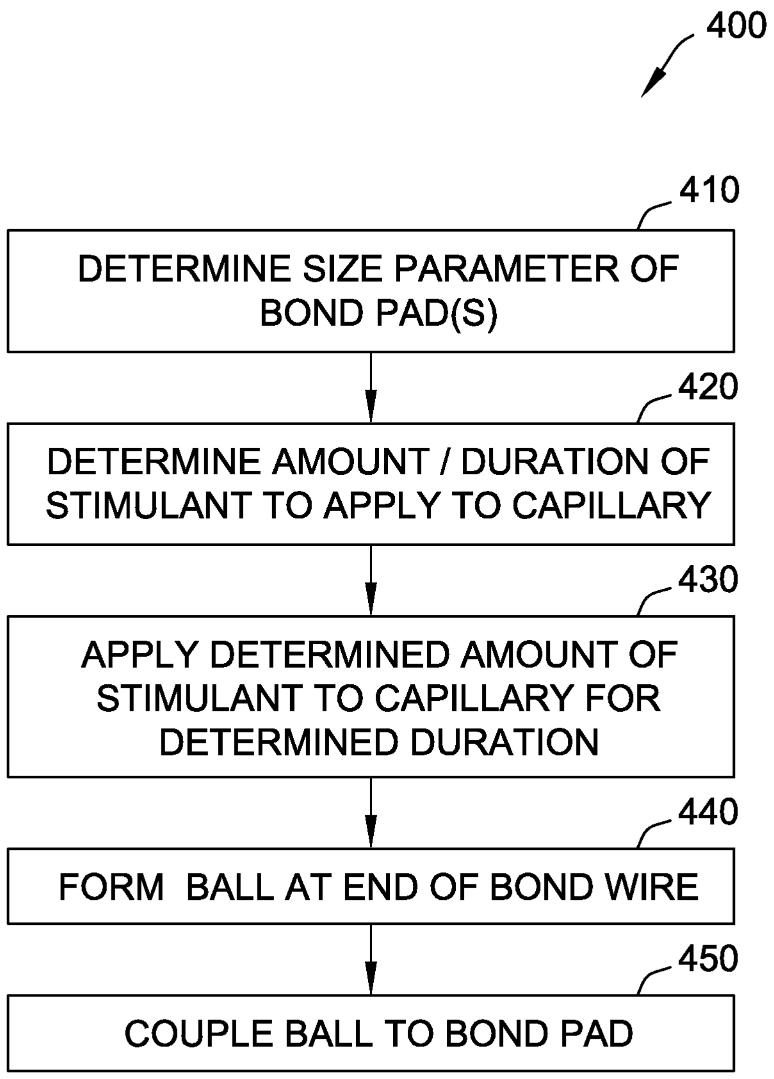
FIG. 4 illustrates a method for altering a state of a capillary of a wire bonder according to an example.

FIG. 4 illustrates a method 400 for altering a state of a capillary of a wire bonder according to an example. In an example, the method 400 may be performed on/by a wire bonder that includes the capillary 100 shown and described with respect to FIG. 1A-FIG. 1B.

The method 400 begins when a size parameter of a bond pad is determined (410). In an example, the size parameter of the bond pad may include the size of the bond pad, a size of a bond pad opening associated with the bond pad and/or a pitch between two or more bond pads. The determination of the size parameter may be made in real time (e.g., by a sensor during a wire bonding process) or substantially real time. In another example, the size parameter of the bond pad may be pre-determined (e.g., programmed into) or otherwise provided to a computing device associated with the wire bonder or to the wire bonder itself.

When the size parameter of the bond pad is determined, a determination (420) is also made regarding an amount and/or a duration of a stimulant to apply to the capillary of the wire bonder. In an example, the amount and/or the duration of the applied stimulant is based, at least in part, on the size parameter of the bond pad. For example, if the size parameter of the bond pad is a first dimension, a first amount and/or duration of the stimulant is applied. However, if the size parameter of the bond pad is a second dimension, a second amount and/or a second duration of the stimulant is applied.

The stimulant is then applied (430) to the capillary in the determined amount and/or for the determined duration. In an example, the capillary includes a shape memory material. As such, when the stimulant is applied to the capillary, a shape of the capillary changes, which also changes a diameter of a chamfer associated with the capillary.

A ball may then be formed (440) at an opening of the capillary. In an example, the ball is part of a bond wire that is disposed within the chamfer of the capillary. A size of the ball may be related and/or proportional to the diameter of the chamfer. The ball may be formed using any suitable technique (e.g., using an electronic flame-off (EFO) wand associated with the wire bonder).

When the ball is formed, the capillary moves toward the bond pad to couple (450) the ball to the bond pad. Additional steps in the wire bonding process may then commence.

Figure 5:
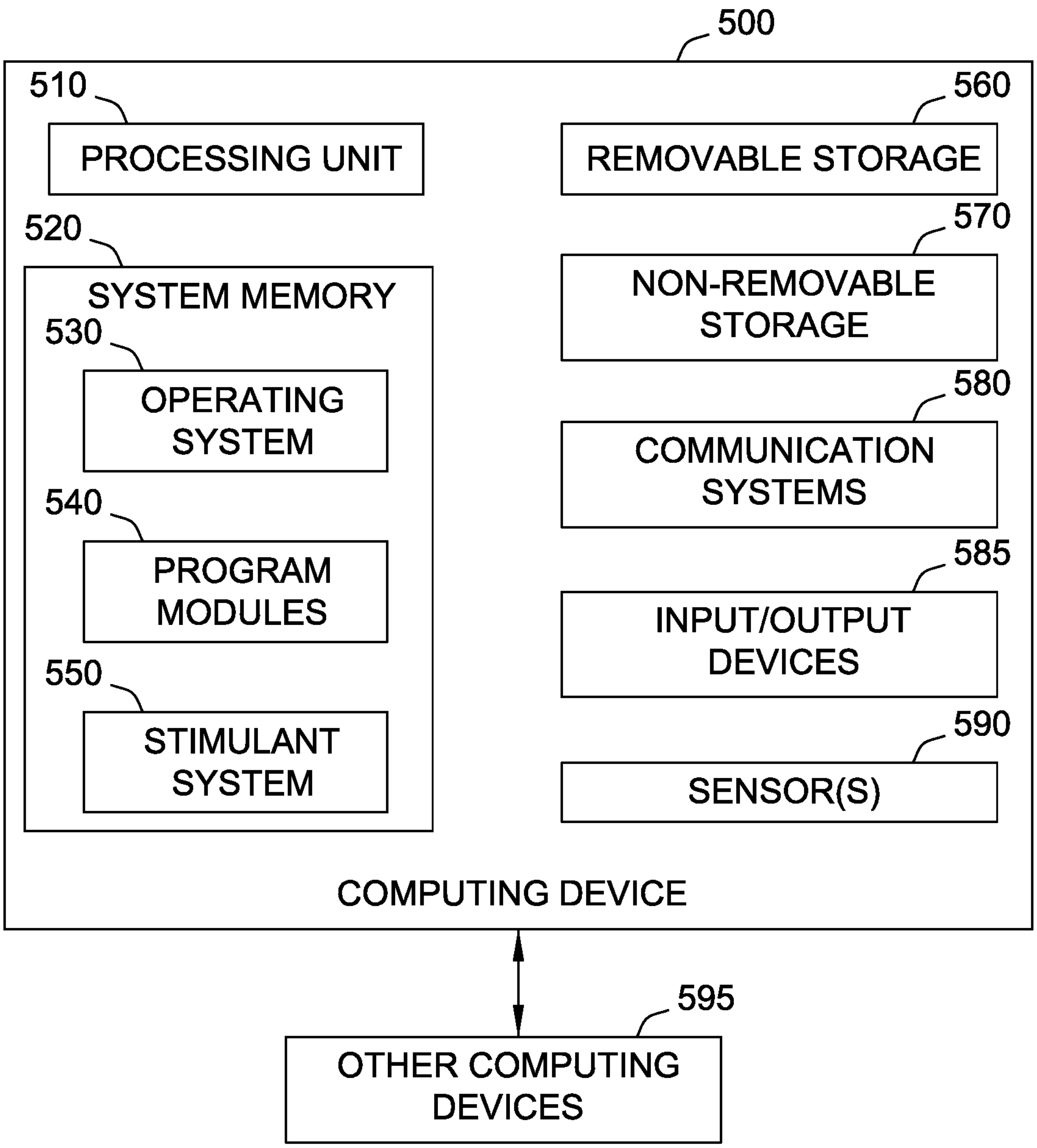
FIG. 5 is a system diagram of a computing device according to an example.

FIG. 5 is a system diagram of a computing device 500 according to an example. The computing device 500, or various components and systems of the computing device 500, may be integrated or associated with a wire bonding machine or device that includes the capillary shown and described with respect to the various examples described herein. For example, the computing device 500, or various components or systems of the computing device 500 may be used to detect size parameters of one or more bond pads provided on a substrate or a printed circuit board. The computing device 500, or the various components or systems of the computing device 500 may also be used to determine an amount and/or a duration of the stimulant that is applied to the capillary which causes the capillary to change states.

As shown in FIG. 5, the physical components (e.g., hardware) of the computing device are illustrated and these physical components may be used to practice the various aspects of the present disclosure. In addition to the various components shown in FIG. 5, the computing device 500 may also include, or otherwise be associated with the capillary 100 shown and described with respect to FIG. 1A-FIG. 1B.

The computing device 500 may include at least one processing unit 510 and a system memory 520. The system memory 520 may include, but is not limited to, volatile storage (e.g., random access memory), non-volatile storage (e.g., read-only memory), flash memory, or any combination of such memories. The system memory 520 may also include an operating system 530 that controls the operation of the computing device 500 and one or more program modules 540. The program modules 540 may be responsible for executing one or more steps of a wire bonding process including determining a size parameter of a bond pad and/or a desired diameter of a chamfer of the capillary. The program modules 540 may also communicate with a stimulant system 550 that is responsible for applying a stimulant to the capillary. While being executed by the processing unit 510, the program modules 540 may perform the various processes described above.

The computing device 500 may also have additional features or functionality. For example, the computing device 500 may include additional data storage devices (e.g., removable and/or non-removable storage devices) such as, for example, magnetic disks, optical disks, or tape. These additional storage devices are labeled as a removable storage 560 and a non-removable storage 570.

Examples of the disclosure may also be practiced in an electrical circuit comprising discrete electronic elements, packaged or integrated electronic chips containing logic gates, a circuit utilizing a microprocessor, or on a single chip containing electronic elements or microprocessors. For example, examples of the disclosure may be practiced via a system-on-a-chip (SOC) where each or many of the components illustrated in FIG. 5 may be integrated onto a single integrated circuit. Such a SOC device may include one or more processing units, graphics units, communications units, system virtualization units and various application functionality all of which are integrated (or "burned") onto the chip substrate as a single integrated circuit.

When operating via a SOC, the functionality, described herein, may be operated via application-specific logic integrated with other components of the computing device 500 on the single integrated circuit (chip). The disclosure may also be practiced using other technologies capable of performing logical operations such as, for example, AND, OR, and NOT, including but not limited to, mechanical, optical, fluidic, and quantum technologies.

The computing device 500 may include one or more communication systems 580 that enable the computing device 500 to communicate with other computing devices 595 or systems. Examples of communication systems 580 include, but are not limited to, wireless communications, wired communications, cellular communications, radio frequency (RF) transmitter, receiver, and/or transceiver circuitry, a Controller Area Network (CAN) bus, a universal serial bus (USB), parallel, serial ports, etc.

The computing device 500 may also have one or more input devices and/or one or more output devices shown as input/output devices 585. These input/output devices 585 may include a keyboard, a sound or voice input device, haptic devices, a touch, force and/or swipe input device, a display, speakers, etc. The aforementioned devices are examples and others may be used.

The computing device 500 may also include one or more sensors 590. The sensors may be image sensors that are used to detect the size parameters of a bond pad, whether the diameter of the chamfer of the capillary has reached (or still has) a desired diameter and/or how much and for how long a stimulant is to be applied to the shape memory material of the capillary.

The term computer-readable media as used herein may include computer storage media. Computer storage media may include volatile and nonvolatile, removable and non-removable media implemented in any method or technology for storage of information, such as computer readable instructions, data structures, or program modules.

The system memory 520, the removable storage 560, and the non-removable storage 570 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 500. Any such computer storage media may be part of the computing device 500. Computer storage media does not include a carrier wave or other propagated or modulated data signal.

In accordance with the present disclosure, one or more examples describe a capillary for a wire bonder, comprising: a first portion defining a first chamfer portion, the first chamfer portion having a static diameter; and a second portion defining a second chamfer portion, the second chamfer portion extending from the first chamfer portion and having a first diameter when the second portion is in a first state and having a second diameter when the second portion is in a second state. In an example, a state of the second portion changes from the first state to the second state based, at least in part, on a voltage applied to the second portion. In an example, a state of the second portion changes from the first state to the second state based, at least in part, on an amount of heat applied to the second portion. In an example, the first portion is comprised of a first material and the second portion is comprised of a shape memory material. In an example, the shape memory material includes one or more of a tungsten alloy and a tungsten composite. In an example, at least one of the first diameter and the second diameter is based, at least in part, on a bond pad opening on which the capillary forms a wire bond. In an example, the capillary also includes an elastomeric material layer provided on the second chamfer portion. In an example, the second portion is at least a portion of a tip of the capillary.

Examples also describe a method, comprising: determining a size parameter associated with a bond pad on a substrate or an integrated circuit; and applying a stimulant to at least a portion of a capillary of a wire bonder, the stimulant causing the at least the portion of the capillary to change from a first state to a second state. In an example, the stimulant is a voltage. In an example, the stimulant is heat. In an example, the at least the portion of the capillary defines a chamfer and wherein a diameter of the chamfer increases as the at least the portion of the capillary moves from the first state to the second state. In an example, the diameter of the chamfer is based, at least in part, on the size of the bond pad opening. In an example, the method also includes forming a ball on the bond pad. In an example, the at least the portion of the capillary includes a shape memory material. In an example, the shape memory material includes one or more of a tungsten alloy and a tungsten composite. In an example, the size parameter is one or more of a bond pad opening associated with the bond pad and a bond pad pitch associated with the bond pad.

Examples also describe a wire bonder, comprising: a bond wire dispensing means defining a chamfer, the chamfer having a first diameter when the wire dispensing means is in a first state and having a second diameter when the wire dispensing means is in a second state; and a stimulant application means that applies a stimulant to the bond wire dispensing means, the stimulant causing the bond wire dispensing means to change from the first state to the second state. In an example, the bond wire dispensing means includes one or more of a tungsten alloy and a tungsten composite. In an example, the stimulant is selected from a group of stimulants comprising: a voltage; and heat.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C. B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone. C alone. A and B together. A and C together. B and C together, or A. B. and C together.

What is claimed is:

1. A wire bonder, comprising:
- a capillary comprising:
- a body portion defining a first chamfer portion, the first chamfer portion having a static diameter; and
- a tip portion comprising a shape memory material and defining a second chamfer portion, the second chamfer portion extending from the first chamfer portion and defining an end point, the second chamfer portion and the end point having a first diameter when the tip portion is in a first state and having a second diameter when the tip portion is in a second state, wherein the second diameter is determined based, at least in part, on a size parameter of a bond pad;
- a stimulant system; and
- a processing unit that:
- determines an amount of a stimulant to apply to the shape memory material based, at least in part, on the size parameter of the bond pad; and
- causes the stimulant system to apply the amount of the stimulant to the shape memory material, thereby causing the tip portion to change from the first state to the second state.

2. The wire bonder of claim 1, wherein the stimulant comprises a voltage.

3. The wire bonder of claim 1, wherein the stimulant comprises heat.

4. The wire bonder of claim 1, wherein the shape memory material includes one or more of a tungsten alloy and a tungsten composite.

5. The wire bonder of claim 1, further comprising an elastomeric material layer provided on the second chamfer portion.

6. The wire bonder of claim 1, wherein the size parameter comprises one or more of a bond pad opening dimension and a pitch between adjacent bond pads.

7. The wire bonder of claim 1, wherein a diameter of a ball formed at the end point is proportional to the second diameter.

8. A wire bonder, comprising:
- a bond wire dispensing means comprising a shape memory material and defining a chamfer, the chamfer comprising:
  - a first portion having a static first diameter; and
  - a second portion extending from the first portion and defining an end point, the second portion and the end point having the first diameter when the bond wire dispensing means is in a first state and having a second diameter when the bond wire dispensing means is in a second state, wherein the second diameter is determined based, at least in part, on an identified size parameter;
- a stimulant system; and
- a processing unit that:
  - determines an amount of a stimulant to apply to the shape memory material based, at least in part, on the identified size parameter; and
  - causes the stimulant system to apply the amount of the stimulant to the shape memory material, thereby causing the bond wire dispensing means to change from the first state to the second state.

9. The wire bonder of claim 8, wherein the bond wire dispensing means includes one or more of a tungsten alloy and a tungsten composite.

10. The wire bonder of claim 8, wherein the stimulant is selected from a group of stimulants comprising:

a voltage; and heat.

11. The wire bonder of claim 8, wherein the identified size parameter comprises one or more dimensions of a bond pad.

12. The wire bonder of claim 8, wherein a diameter of a ball formed at the end point is proportional to the second diameter of the end point.

13. The wire bonder of claim 8, further comprising an elastomeric layer provided on an inner surface of the second portion of the chamfer.

14. The wire bonder of claim 8, wherein the identified size parameter is determined by a sensor associated with the wire bonder.

15. The wire bonder of claim 8, wherein the processing unit further determines a duration for which the stimulant is applied based, at least in part, on the identified size parameter.

16. A wire bonder, comprising:

a capillary comprising:

a body portion defining a first chamfer portion, the first chamfer portion having a static diameter; and a tip portion comprising a shape memory material and defining a second chamfer portion, the second chamfer portion extending from the first chamfer portion and defining an end point, the second chamfer portion and the end point having a first diameter when the tip portion is in a first state and having a second diameter, different from the first diameter, when the tip portion is in a second state, wherein the second diameter is determined based, at least in part, on a size parameter of a bond pad, and wherein a size of a ball formed at the end point is based, at least in part, on the second diameter;

a stimulant system; and a processing unit that:

determines an amount of a stimulant to apply to the shape memory material based, at least in part, on the size parameter of the bond pad; and causes the stimulant system to apply the amount of the stimulant to the shape memory material, thereby causing the tip portion to change from the first state to the second state.

17. The wire bonder of claim 16, wherein the stimulant comprises at least one of a voltage and heat.

18. The wire bonder of claim 16, wherein the body portion is comprised of a first material and the shape memory material comprises one or more of copper, nitinol, nickel, titanium, a tungsten alloy, and a tungsten composite.

19. The wire bonder of claim 16, wherein the size parameter comprises one or more of a bond pad opening dimension and a pitch between adjacent bond pads.

20. The wire bonder of claim 16, further comprising an elastomeric material layer provided on an inner surface of the second chamfer portion.

* * * * *